United States Patent
Chen et al.

(10) Patent No.: US 12,389,633 B2
(45) Date of Patent: Aug. 12, 2025

(54) SOURCE/DRAINS IN SEMICONDUCTOR DEVICES AND METHODS OF FORMING THEREOF

(71) Applicant: Taiwan Semiconductor Manufacturing Co., Ltd., Hsinchu (TW)

(72) Inventors: Chi-Ming Chen, Zhubei (TW); Kuei-Ming Chen, New Taipei (TW); Po-Chun Liu, Hsinchu (TW); Chung-Yi Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/854,328

(22) Filed: Jun. 30, 2022

(65) Prior Publication Data

US 2022/0328640 A1     Oct. 13, 2022

Related U.S. Application Data

(62) Division of application No. 16/901,512, filed on Jun. 15, 2020, now Pat. No. 11,824,099.

(51) Int. Cl.
*H10D 30/68*     (2025.01)
*H10D 30/62*     (2025.01)
*H10D 30/67*     (2025.01)

(52) U.S. Cl.
CPC ........... *H10D 30/673* (2025.01); *H10D 30/62* (2025.01); *H10D 30/689* (2025.01)

(58) Field of Classification Search
CPC ............ H01L 29/42384; H01L 29/785; H01L 29/7889; H01L 21/31116; H01L 29/6653;
(Continued)

(56) References Cited

U.S. PATENT DOCUMENTS 6,316,316 B1    11/2001   Wu
9,647,116 B1 *   5/2017   Lee ................... H01L 21/76897
(Continued)

FOREIGN PATENT DOCUMENTS

DE       102009010882 A1    9/2010
KR          20100099047 A    9/2010
KR          20150029502 A    3/2015

*Primary Examiner* — Moin M Rahman
(74) *Attorney, Agent, or Firm* — Slater Matsil, LLP

(57) ABSTRACT

A method includes forming a gate structure over a silicon on insulator (SOI) substrate. The SOI substrate comprising: a base semiconductor layer; an insulator layer over the base semiconductor layer; and a top semiconductor layer over the insulator layer. The method further includes depositing a gate spacer layer over a top surface and along a sidewall of the gate structure; etching the gate spacer layer to define a gate spacer on the sidewall of the gate structure; after etching the gate spacer layer, etching a recess into the top semiconductor layer using a first etch process; and after the first etch process, extending the recess further into the top semiconductor layer using a second etch process. The first etch process is different from the second etch process. The method further includes forming a source/drain region in the recess after the second etch process.

16 Claims, 9 Drawing Sheets

(58) Field of Classification Search
CPC .......... H01L 29/6656; H01L 29/66636; H01L 29/78618; H01L 29/78654; H01L 29/78696; H01L 29/66772; H01L 29/66545; H01L 29/0847; H01L 29/1079; H01L 29/78; H01L 21/30604; H01L 21/3065; H01L 29/4983; H01L 29/7848; H01L 29/6681; H01L 21/02164; H01L 21/0217; H01L 21/02532; H01L 21/762; H01L 29/0649; H01L 29/66795; H01L 21/76224; H01L 21/823431; H01L 21/823821; H01L 21/845; H01L 27/0886; H01L 27/0924; H01L 27/10826; H01L 27/10879; H01L 27/1211; H01L 29/41791; H01L 2924/13067; H01L 21/02603; H01L 21/28568; H01L 25/105; H01L 21/30625; H01L 21/6835; H10D 30/60–798; H10D 30/021–0415; H10D 84/83–859; H10D 62/364; H10D 84/0128; H10D 84/0167; H10D 62/85–854; H10D 30/751; H10D 30/027–0278; H10D 30/63; H10D 84/016; H10D 84/0195; H10D 30/43–435; H10D 62/119–123; H10D 30/014; H10D 62/121; H10D 30/6735; H10D 30/794; H10D 30/797; H10D 62/115; H10D 62/151; H10D 62/292; H10D 62/822; H10D 64/017; H10D 64/021; H10D 64/257; H10D 64/62; H10D 30/0323; H10D 30/6744; H10D 30/6757; H10D 64/251; H10D 62/116; H10D 84/0193; H10D 84/853; H10D 84/85; H10D 30/6728; H10D 30/6733; H10D 62/118; H10D 89/931; H10D 64/252; H10D 84/0188; H10D 84/201; H10D 18/60; H10D 30/62–6219; H10D 30/024–0245; H10D 84/0158; H10D 86/011; H10D 84/834; H10D 86/215; H10D 30/673; H10D 30/689; H10D 30/6713; H10D 62/021; H10D 64/015; H10D 64/671; H10B 63/34; H10B 12/36; H10B 12/056; Y10S 977/938; H02K 15/027; A23B 2/783; A45C 11/003; A61K 40/4218; H10F 77/955; H10H 20/826; B82Y 10/00

See application file for complete search history.

(56) References Cited

U.S. PATENT DOCUMENTS

| | | |
|---|---|---|
| 10,283,624 B1 | 5/2019 | Lee et al. |
| 2006/0033178 A1 | 2/2006 | Matsuo et al. |
| 2007/0194387 A1* | 8/2007 | Dyer ............... H01L 21/823418 257/E29.267 |
| 2010/0219450 A1 | 9/2010 | Kim et al. |
| 2010/0219474 A1* | 9/2010 | Kronholz .......... H01L 29/78654 438/300 |
| 2011/0130004 A1 | 6/2011 | Lee |
| 2011/0193167 A1* | 8/2011 | Fung ................. H01L 21/26506 257/350 |
| 2011/0227156 A1* | 9/2011 | Khater ............... H01L 29/7839 257/347 |
| 2012/0205715 A1 | 8/2012 | Kwok et al. |
| 2013/0037919 A1 | 2/2013 | Sapra et al. |
| 2014/0057404 A1 | 2/2014 | Qin et al. |
| 2014/0353741 A1 | 12/2014 | Montanini et al. |
| 2015/0069466 A1 | 3/2015 | Chang et al. |
| 2015/0228735 A1* | 8/2015 | Zhong ............... H01L 21/31116 257/190 |
| 2016/0056261 A1 | 2/2016 | Thees et al. |
| 2017/0179238 A1 | 6/2017 | Cheng et al. |
| 2018/0164683 A1 | 6/2018 | Fujiwara et al. |
| 2019/0097006 A1* | 3/2019 | Li .................... H01L 29/66795 |
| 2020/0020771 A1 | 1/2020 | Chen et al. |
| 2020/0105527 A1 | 4/2020 | Vellianitis |
| 2020/0185229 A1 | 6/2020 | Kon et al. |

* cited by examiner

SOURCE/DRAINS IN SEMICONDUCTOR DEVICES AND METHODS OF FORMING THEREOF

PRIORITY CLAIM AND CROSS-REFERENCE

This patent is a divisional of U.S. application Ser. No. 16/901,512, filed on Jun. 15, 2020, which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
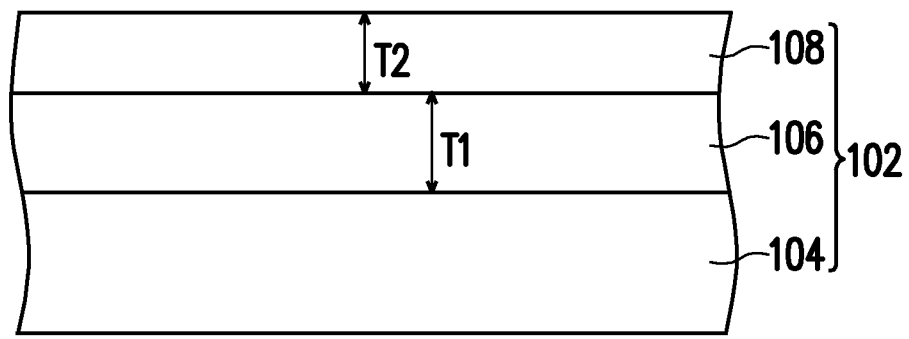
FIGS. 1 through 6, 7A, 7B, 7C, and 10 through 15 illustrate various intermediary steps of manufacturing a transistor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a fully depleted silicon on insulator (FDSOI) transistor having raised source/drain regions (e.g., extending above a top surface of a substrate). The FDSOI transistor may be formed on a top silicon layer of a silicon on insulator (SOI) substrate. To form the source/drain regions, the top silicon layer may be etched to define source/drain recesses using a fluorine-ozone mixture (FOM) process, for example. The etching provides source/drain recesses that allows the source/drain region to extend deeper into the top silicon layer, thereby reducing parasitic resistance in the resulting transistor and improving electrical performance. Further, a sufficiently thick portion of the top silicon layer remains underneath the source/drain region, which advantageously provides support to the overlying features during subsequent processing steps. For example, in various embodiments, about 10Å to about 50Å, such as about 20Å to about 30Å, of the top silicon layer remains under the source/drain recesses. Thus, manufacturing defects (e.g., SOI substrate cracking caused by coefficient of thermal expansion (CTE) mismatch between the top silicon layer and the underlying buried oxide (BOX) layer) can be advantageously reduced.

While various embodiments are described herein in the context of planar transistor, it should be understood that embodiments are not limited to a planar transistor, For example, various embodiments may also be applied to dual-gate devices, fin field effect transistor (FinFET) devices, nanostructure (also referred to as gate all around) devices, or the like.

FIGS. 1 through 6, 7A, 7B, 7C, and 10 through 15 illustrate cross-sectional views of intermediate steps of manufacturing a device 100 in accordance with various embodiments. In various embodiments, the device 100 may be manufactured as part of a semiconductor wafer having multiple device regions. Transistors are fabricated in each of the device regions, and interconnect structures are formed over the transistors to provide functional circuits. After the functional circuits are manufactured, individual device regions may be separated from other device regions in the semiconductor wafer using a suitable singulation process. Thus, individual semiconductor dies (sometimes referred to as bare dies) are formed from the circuits of the singulated device regions.

Referring to FIG. 1, a substrate 102 is illustrated. Substrate 102 may be a SOI substrate comprising a base semiconductor layer 104, an insulator layer 106, and a top semiconductor layer 108. Generally, an SOI substrate is a layer of a semiconductor material (e.g., top semiconductor layer 108) formed on an insulator layer (e.g., insulator layer 106). Base semiconductor layer 104 provides a support substrate on which other features (including insulator layer 106 and top semiconductor layer 108) are formed. In some embodiments, the base semiconductor layer 104 is a silicon substrate or a glass substrate. Other materials may also be used.

Insulator layer 106 may be, for example, a buried oxide (BOX) layer, a silicon oxide layer, or the like. In some embodiments, the insulator layer 106 may be relatively thin. As a result, body biasing may be applied more efficiently to subsequently formed transistors through the base semiconductor layer 104, and switching speeds of the resulting transistors can be improved. Further, the inclusion of the insulator layer 106 allows for a higher biasing voltage to be applied, which allows the resulting transistors to be controlled more effectively. For example, the electrical behavior of the resulting transistors can be controlled through its gate as well as through polarizing the underlying base semiconductor layer 104. As a result, the resulting transistor may be functionally similar to a dual gate device. For example, in an embodiment, a thickness T1 of the insulator layer 106 may be in the range of about 50 nm to about 300 nm. In other embodiments, the insulator layer 106 may have other dimensions.

The top semiconductor layer 108 may be a semiconductor layer, such as a silicon layer. In some embodiments, the top semiconductor layer 108 is relatively thin to improve mobility of transistors formed on the top semiconductor layer 108. For example, in an embodiment, a thickness T1 of the top semiconductor layer 108 may be in the range of about 6 nm to about 8 nm. In other embodiments, the top semiconductor layer 108 may have other dimensions. Due to the thinness of the top semiconductor layer 108, a channel region of the resulting transistor can be completely undoped and pocket implantation need not be performed. Further, a thin top semiconductor layer 108 with an underlying insulator layer 106 confines the flow of electrons between the source and drain regions of the resulting transistor, which reduces leakage currents.

Although one region of the substrate 102 is illustrated, it should be understood that the substrate 102 may include many regions where different type of devices (e.g., n-type devices and p-type devices) are fabricated. Any number of features (e.g., isolation regions, and the like) may be disposed between n-type and p-type device regions. The structures illustrated in the remaining figures may be applicable to both the n-type device regions and the p-type device regions. Differences (if any) in the structures of the n-type device regions and the p-type device regions are described in the text accompanying each figure.

Figure 2:
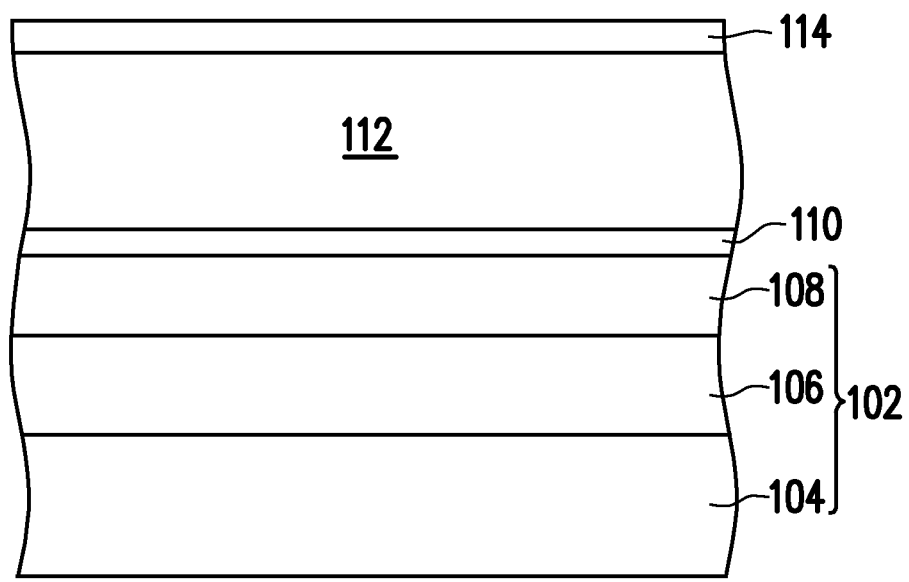

In FIG. 2, a dummy dielectric layer 110 is formed on the top semiconductor layer 108. The dummy dielectric layer 110 may be, for example, silicon oxide, silicon nitride, a combination thereof, or the like, and may be deposited or thermally grown according to acceptable techniques.

A dummy gate layer 112 is formed over the dummy dielectric layer 110. The dummy gate layer 112 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 112 may be deposited by physical vapor deposition (PVD), chemical vapor deposition (CVD), sputter deposition, or other techniques for depositing conductive materials.

A mask layer 114 may be deposited over the dummy gate layer 112. The mask layer 114 may include, for example, SiN, SiON, or the like. In this example, a single dummy gate layer 112 and a single mask layer 114 are formed. In some embodiments, separate dummy gate layers may be formed in the n-type device regions versus the p-type device regions, and separate mask layers may be formed in the n-type device regions versus the p-type device regions.

Figure 3:
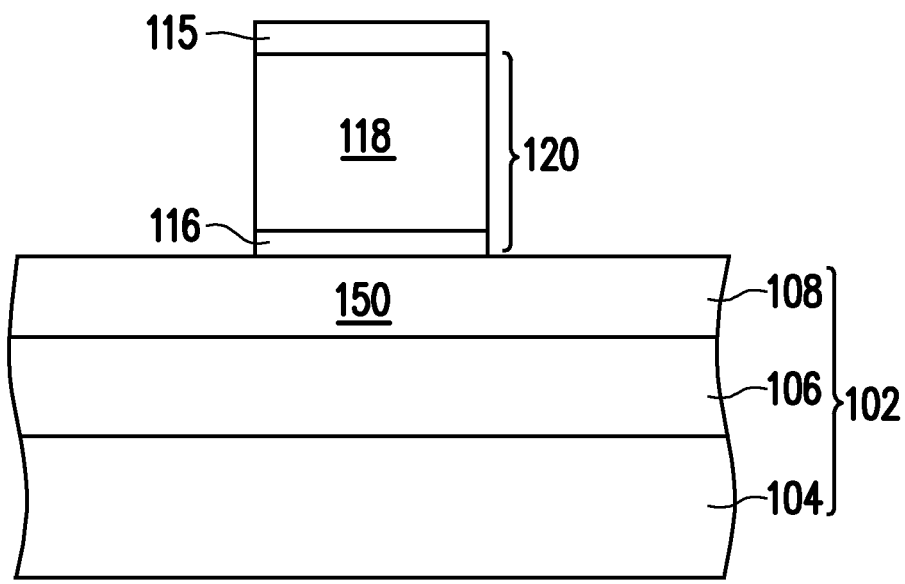

In FIG. 3, the mask layer 114 (see FIG. 7) may be patterned using acceptable photolithography and etching techniques to form masks 115. The pattern of the masks 115 then may be transferred to the dummy gate layer 112 to form dummy gate electrodes 118. The pattern of the masks 115 may also be transferred to the dummy dielectric layer 110 by an acceptable etching technique to form dummy gate dielectrics 116. Thus, dummy gates 120 comprising the dummy gate electrodes 118 and the dummy gate dielectrics 116 are formed. The dummy gates 120 cover respective channel regions 150 of the top semiconductor layer 108. The pattern of the masks 115 may be used to physically separate each of the dummy gates 120 from adjacent dummy gates. Purely for ease of illustration, only a single dummy gate 120 is illustrated, but it should be understood that multiple dummy gates 120 are formed on the substrate 102.

In some embodiments, the channel regions 150 are undoped. For example, no implantation processes may be performed on the top semiconductor layer 108 until the growth of subsequently formed source/drain regions (see FIG. 10). In some embodiments, lightly-doped drain regions (LDD regions) are not formed in the top semiconductor layer 108, and pocket implantation is not performed.

Although one layer of masks 115 is illustrated, various patterning techniques to form the dummy gates 120 may use multiple layers of masks 115. For example, the dummy gates 120 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the dummy gates 120.

In the illustrated embodiment, the masks 115 may remain on the dummy gates 120. In other embodiments, the masks 115 may be removed after the dummy gates 120 are formed and prior to the formation of other features (e.g., gate spacer layer 122, see FIG. 4).

Figure 4:
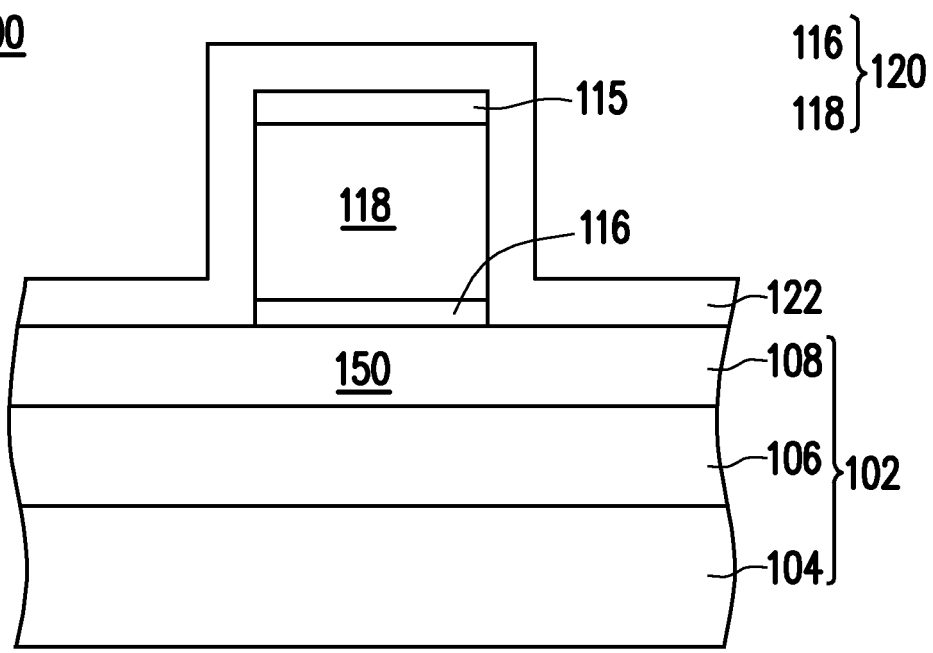

In FIG. 4, a gate spacer layer 122 is deposited over and along sidewalls of the dummy gates 120. In embodiments where the masks 115 is not removed, the gate spacer layer 112 is also deposited over the masks 115. The gate spacer layer 122 formed by conformally depositing using a suitable process, such as, CVD, atomic layer deposition (ALD), or the like. The insulating material of the gate spacer layer 122 may be silicon oxide, silicon nitride, silicon oxynitride, silicon carbonitride, multilayers thereof, or the like.

Figure 5:
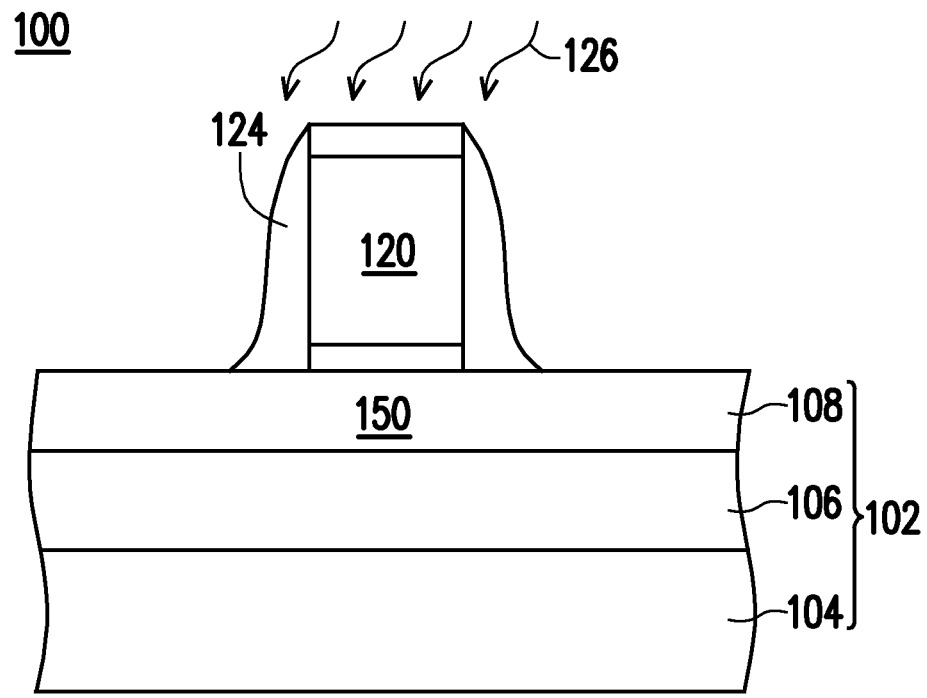

In FIG. 5, the gate spacer layer 122 is patterned to define gate spacers 124 on sidewalls of the gate stacks 120. Patterning the gate spacer layer 122 may comprise an anisotropic etching process 126, for example. In some embodiments, the etching process 126 is a dry etching process using a suitable etchant, such as a chlorine-based etchant. The etching process 126 may be a plasma process in some embodiments. In some embodiments, the etching process 126 may be a high-power etching process using a RF power in a range of about 10 KW to about 100 KW. Further, the etching process 126 may be a timed etching process to define the shape of the gate spacers 124. For example, a length of the etching process 126 may be in a range of about 30 s to about 150 s. In other embodiments, the etching process 126 used to define the spacers 124 may comprise a different set of parameters.

Figure 6:
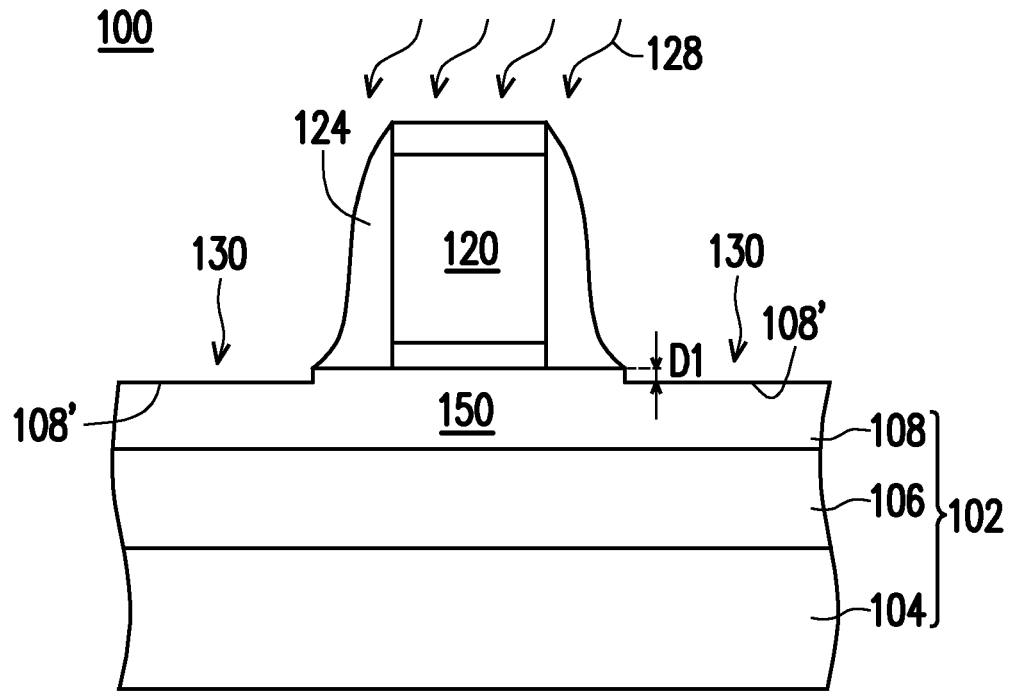

In FIG. 6, an additional etching process 128 may be applied. The etching process 128 may be formed in-situ (e.g., in a same processing chamber) after the etching process 126. In some embodiments, the etching process 126 described in FIG. 5 may damage exposed surfaces 108' of the top semiconductor layer 108 (e.g., surfaces of the top semiconductor layer 108 not covered by the gate stacks 120 or the gate spacers 124). The etching process 128 may etch exposed surfaces 108' of the top semiconductor layer 108 to reduce surface damage of the top semiconductor layer 108. For example, the etching process 128 may reduce a roughness of the exposed surfaces 108' such that subsequently formed source/drain regions (see source/drain regions 142 in FIG. 10) may be grown with fewer defects.

In some embodiments, the etching process 128 is a dry etching process using a suitable etchant, such as a chlorine-based etchant. The etching process 126 may be a plasma process in some embodiments. The etching process 128 may be a low-power etching process using a lower RF power than the etching process 126. For example, the etching process 128 may use an RF power in a range of about 15 W to about 1 KW. Further, the etching process 128 may be a timed etching process. For example, a length of the etching process 126 may be in a range of about 5 s to about 150 s. In other embodiments, the etching process 128 may comprise a different set of parameters.

In other embodiments, the etching process 128 may comprise one or more wet etching process(es) in addition to or in lieu of the dry etching process. For example, wet etching process(es) may be applied after the dry etching process, or the wet etching processes(s) may be applied instead of the dry etching process. The wet etching process(s) may be cleaning process(es) that remove surface particles, native oxide layers, or the like formed on the exposed surfaces 108' of the top semiconductor layer 108. The wet etching process(es) may further passivate the exposed surfaces 108' of the top semiconductor layer 108. The wet etching process(s) may use any combination of the following etchants: tris-borate-ethylene diamine tetraacetic acid (TBE), Sulphur peroxide mixture (SPM), an SC-1 solution (e.g., comprising ammonia, deionized water, and hydrogen peroxide), an SC-2 solution (e.g., comprising ammonia, deionized water, and hydrogen peroxide), or the like. For example, a first wet etching process using TBE, the SC-1 solution, and the SC-2 solution may be applied to the exposed surfaces 108', and a second wet etching process using SPM and the SC-1 solution may then be applied to the exposed surfaces 108'. In embodiments where wet etching process(s) are used, a drying and spinning process may be applied to the semiconductor wafer after the wet process(s).

A combination of the etching processes 126 and 128 may recess the exposed surfaces 108' of the top semiconductor layer 108. For example, the etching processes 126 and 128 may form recesses 130 in the top semiconductor layer 108. The recesses 130 may extend a depth D1, which is a height difference between a topmost surface of the top semiconductor layer 108 and a bottom surface of the recesses 130. In some embodiments, the depth D1 may be in a range of about 5 Å to about 50 Å. In some embodiments, the depth D1 may be in a range of more than zero and less than 6 Å. The recesses 130 may extend to a different depth in other embodiments. The etching process 128 may be a slight etching process for removing the defects on surface of the top semiconductor layer 108 and slightly flattening the top semiconductor layer 108.

In the etching process 128, the gate spacers 124 may mask one or more portions of the top semiconductor layer 108 neighboring the gate stacks 120. Thus, each recess 130 is separated from the gate stacks 120 and its underlying dummy gate dielectrics 116 by the top semiconductor layer 108. For example, the recesses 130 may not horizontally extend to the dummy gate dielectrics 116.

Figure 7A:
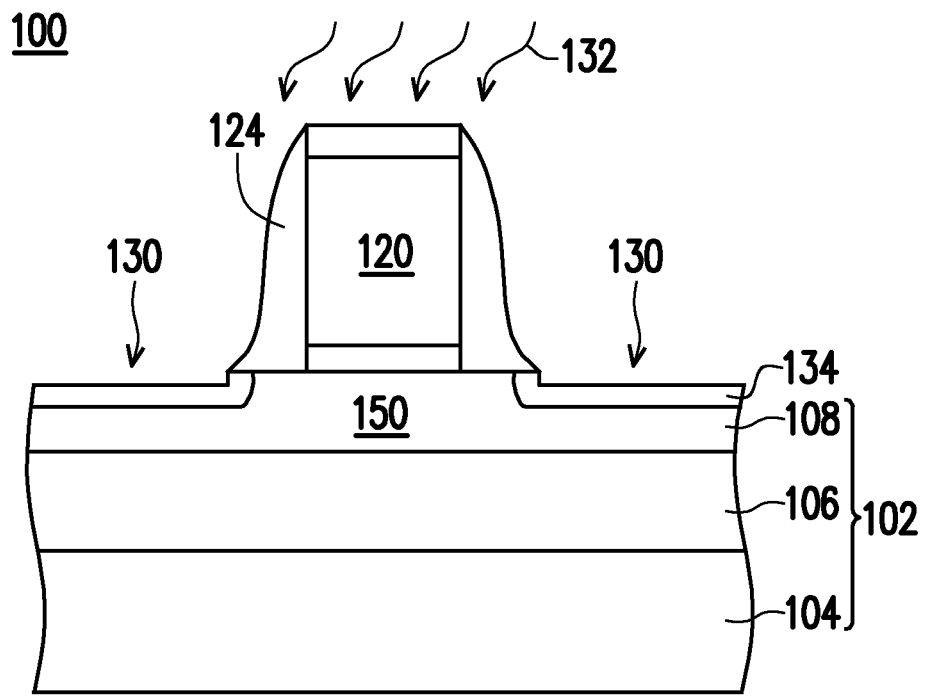
Figure 7B:
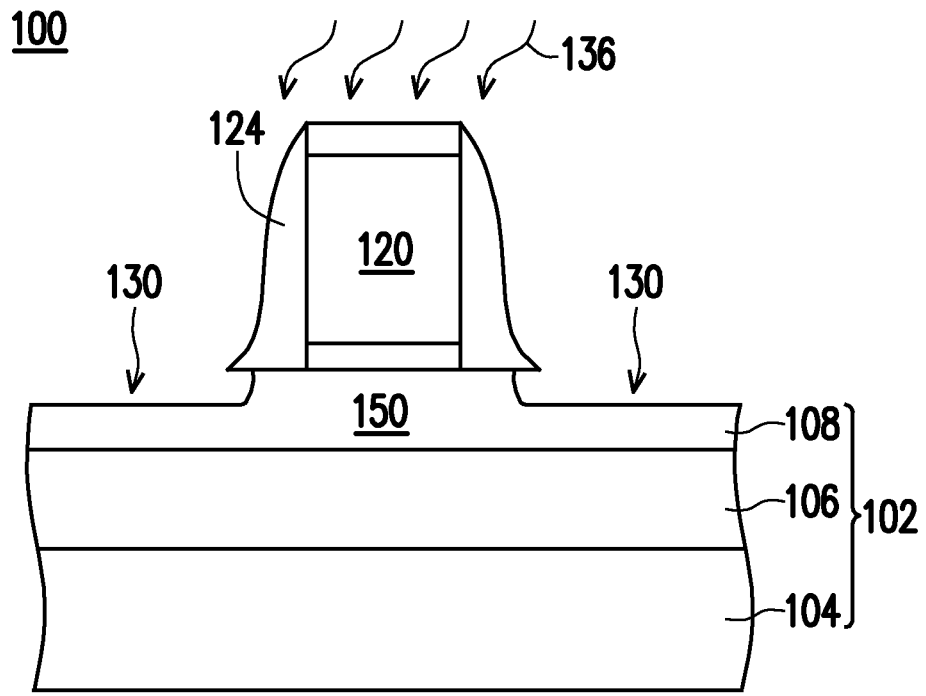
Figure 7C:
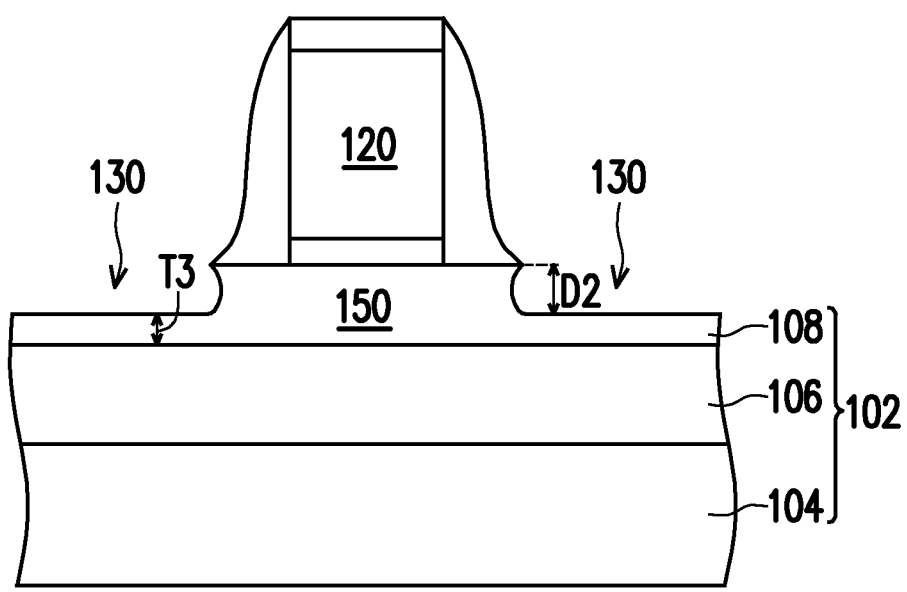

In FIGS. 7A through 7C, the recesses 130 are further extended into the top semiconductor layer 108. By extending the recesses 130, subsequently grown source/drain regions in the recesses 130 (e.g., source/drain regions 142, see FIG. 10) can extend further into the substrate 102. As a result, electrical performance of the resulting transistor can be improved. For example, it has been observed that parasitic capacitance of the resulting devices can be reduced compared to source/drain regions that do not extend deeply into the substrate 102.

Extending the recesses 130 may comprise a cyclical, FOM process. The FOM process may be performed in-situ after the etching process 128, or the FOM process may be performed ex-situ (e.g., in a different processing chamber) as the etching process 128.

FIGS. 7A and 7B illustrate one cycle of the FOM process. First, as illustrated by FIG. 7A, an oxidation process 132 may be applied to exposed surfaces of the recesses 130. The oxidation process 132 forms oxide regions 134 in portions of the top semiconductor layer 108 exposed by the recesses 130. In embodiments where the top semiconductor layer 108 is a silicon layer, the oxide regions 134 are silicon oxide regions.

The oxidation process 132 may include flowing a process gas comprising ozone ($O_3$) over surfaces of the recesses 130. The process gas may have ozone at a concentration in a range of 20 parts per million (ppm) to 40 ppm. The oxidation process 132 may be performed for a duration of 20 s to 30 s in some embodiments. The oxidation process 132 may be a self-limiting process. For example, the oxidation process 132 continues to form the oxide regions 134 in the top semiconductor layer 108 until upper portions of the top semiconductor layer 108 are saturated with oxygen. Because the recesses 130 are separated from the gate stacks 120 after the etching process 128, and the gate spacers 124 also masks one or more portions of the top semiconductor layer 108 neighboring the gate stacks 120, each oxide region 134 can still be separated from the gate stacks 120 and its underlying dummy gate dielectrics 116 by the top semiconductor layer 108. The oxide regions 134 may not horizontally extend to the dummy gate dielectrics 116.

Next, as illustrated in FIG. 7B, an etching process 136 removes the oxide regions 134. The etching process 136 may be a wet etch using diluted hydrogen fluoride (dHF), for example. The hydrogen fluoride may be diluted in water (e.g., deionized water, or the like) to a dilution in a range of about 50:1 to about 150:1. In other embodiments, a different etchant may be used. The etching process 136 may be performed may be performed for a duration of 20 s to 40 s in some embodiments. The etching process 136 may be selective between the oxide regions 134 and the top semiconductor layer 108 such that the etching process 136 removes the oxide regions 134 without significantly etching the remaining (e.g., unoxidized) top semiconductor layer 108.

Because the oxidation process 132 is a self-limiting process and the etching process 136 is a selective process, the amount of top semiconductor layer 108 removed during each cycle of the FOM process can be precisely controlled. The cycle illustrated in FIGS. 7A and 7B (e.g., oxidation process 132 and the etching process 136) may be repeated any number of times until the recesses 130 are extended a desired thickness into the top semiconductor layer 108. In an example, two cycles of oxidation and etching is performed to extend the recesses 130 into the top semiconductor layer 108. In other embodiments, a different number of cycles may be used.

After the desired number of cycles of the FOM process is performed, the resulting structure is illustrated in FIG. 7C. As a result of the FOM process, the openings 130 extend a depth D2 into the top semiconductor layer 108. In some embodiments, the depth D2 is in a range of about 10 Å to about 100 Å, such as between about 20Å to about 30Å or between about 17Å to about 25Å. It has been observed that by extending the recesses 130 into the top semiconductor layer 108 to a depth in the above range, electrical performance of the resulting transistor can be improved. For example, source/drain regions (see FIG. 10) are subsequently formed in the recesses 130. Deeper recesses 130 (e.g., recesses with the above depth) allow for source/drain regions to extend further into the top semiconductor layer 108, which reduces diffusion of dopants from the source/drain region into the undoped channel region of the transistor (e.g., region 150, see FIG. 15). By reducing dopant diffusion, parasitic resistance of the channel region 150 can be advantageously reduced. For example, it has been observed in simulation data that parasitic resistance be reduced by about 40Ω per μm when recesses 130 have a depth D2 of about 20 Å. It has also been observed in simulation data that performance boost of 6% or more can be achieved in nMOS transistors with embodiment source/drain regions extending the above described depth into the top semiconductor layer 108. Accordingly, the recesses 130 of the top semiconductor layer 108 are horizontally extended to below the gate spacers 124, and do not extend to the dummy gate dielectrics 116 after the FOM process.

However, it is also observed that it is desirable for a portion of the top semiconductor layer 108 to remain under the recesses 130. For example, the recesses 130 may be separated from the insulator layer 106 by the top semiconductor layer 108, and a thickness T3 of the top semiconductor layer 108 between the recesses 130 and the insulator layer 106 may be in the range of about 10 Å to about 50 Å, such as about 20 Å to about 30 Å. Due to differences in CTE of the top semiconductor layer 108 (e.g., comprising silicon) and the insulator layer 106 (e.g., comprising silicon oxide), the top semiconductor layer 108 may be prone to cracking when it is overly thin. The risk of cracking may be increased during subsequent processes that involve heating the wafer. By leaving a portion of the top semiconductor layer 108 at the above thickness range, manufacturing defects (e.g., cracking) can be avoided. It has been observed that when the recesses 130 are extended deeper into the top semiconductor layer 108 such that the thickness T3 is outside of the above ranges, increased cracking of the substrate 102 results.

Figure 8:
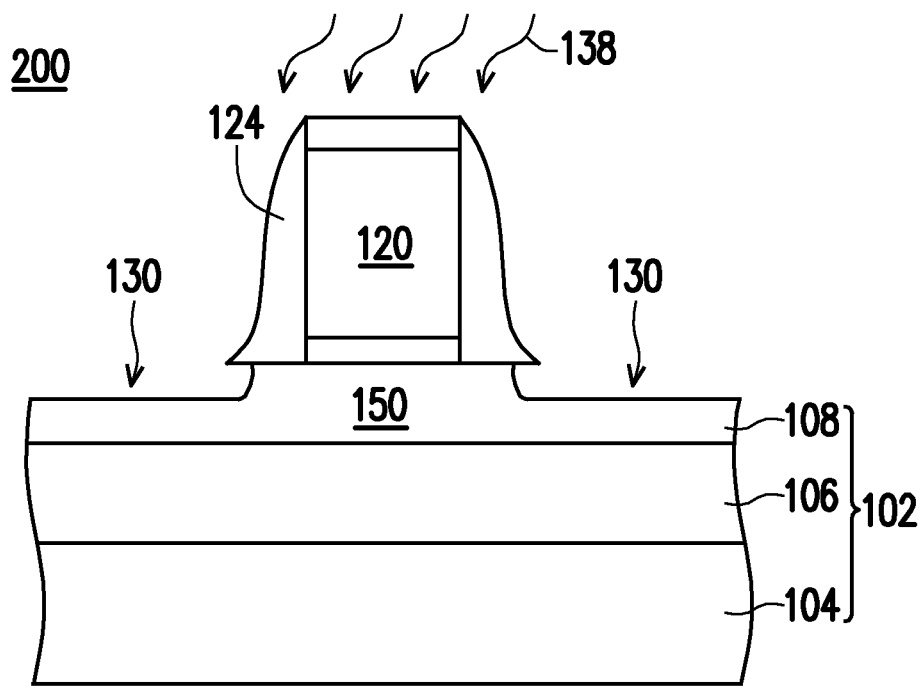
FIG. 8 illustrates an intermediary step of manufacturing a transistor device in accordance with some embodiments.

FIGS. 7A and 7B illustrate one method of achieving the embodiment structure of FIG. 7C. Other methods may also be used. For example, FIG. 8 illustrates a method of extending the openings 130 in a device according to another embodiment. In FIG. 8, the structure may be similar to FIG. 7A and like reference numerals indicate like elements formed using like processes. A dry etch process 138 is used to extend the openings 130. The dry etch process 138 uses a suitable etchant, such as a chlorine-based etchant. The dry etch process 138 may be a plasma process. In some embodiments, the dry etch process 138 may be a low-power etching process using an RF power in a range of about 15 W to about 1 KW, for example. Further, the dry etch process 138 may be a timed etching process. For example, a length of the dry etch process 138 may be in a range of 5 s to about 150 s. In other embodiments, the dry etch process 138 may comprise a different set of parameters. The dry etch process 138 results in a structure similar to that illustrated in FIG. 7C. Subsequent processing (e.g., as described below in FIGS. 10 through 15) may be performed to complete the device.

Figure 9:
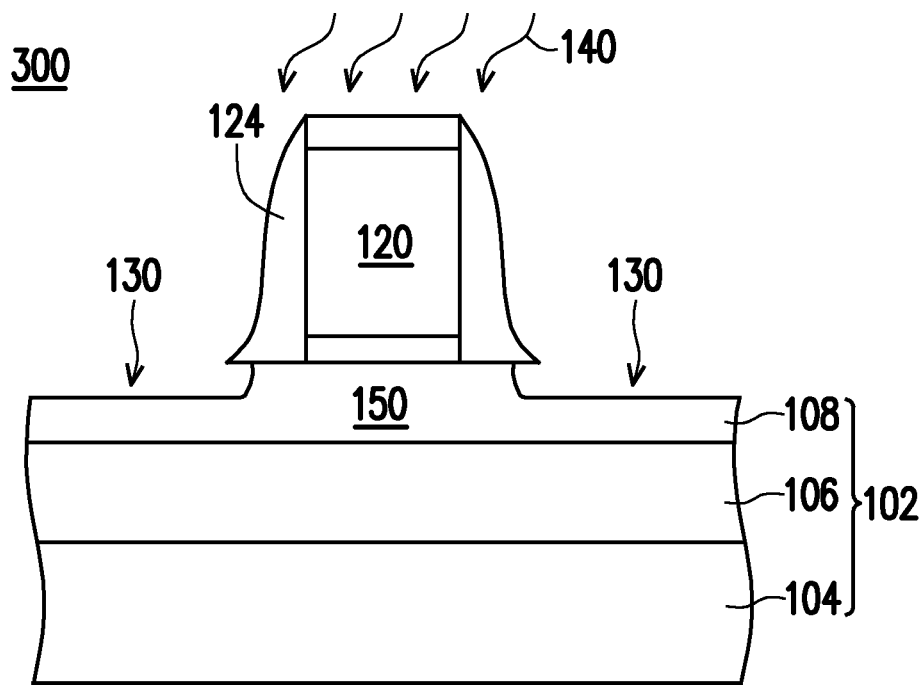
FIG. 9 illustrates an intermediary step of manufacturing a transistor device in accordance with some embodiments.

FIG. 9 illustrates yet another method of extending the openings 130. In FIG. 9, a wet etch process 140 is used to extend the openings 130. In FIG. 9, the structure may be similar to FIG. 7A and like reference numerals indicate like elements formed using like processes. The wet etch process 140 uses a suitable etchant, such as a solution comprising $H_3PO_4$, or the like. Further, the wet etch process 140 may be a timed etching process. For example, a length of the wet etch process 140 may be in a range of 10 s to about 180 s. In other embodiments, the wet etch process 140 may comprise a different set of parameters. The wet etch process 140 results in a structure similar to that illustrated in FIG. 7C. Subsequent processing (e.g., as described below in FIGS. 10 through 15) may be performed to complete the device.

Figure 10:
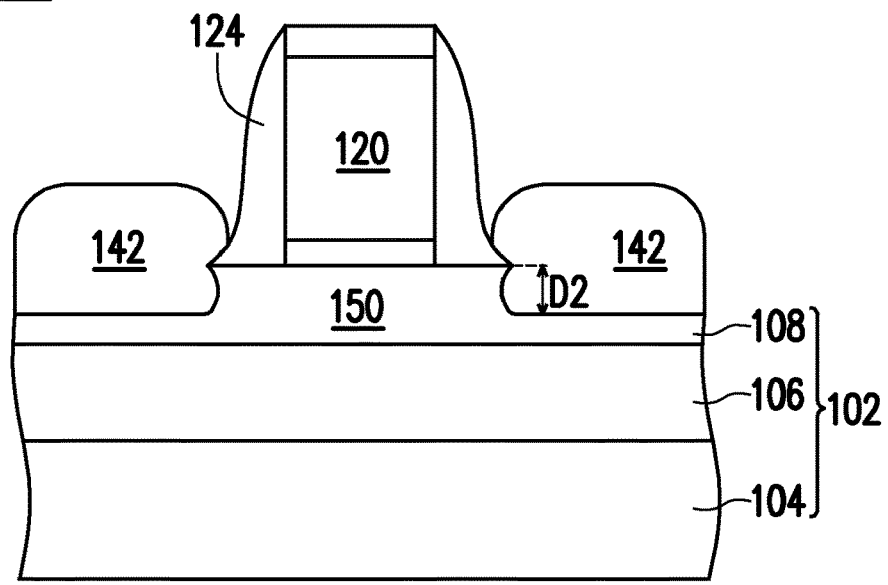

In FIG. 10, epitaxial source/drain regions 142 are formed in the recesses 130. The epitaxial source/drain regions 142 may exert stress in the respective channel regions of the resulting transistor, thereby improving performance. The epitaxial source/drain regions 142 are formed in the top semiconductor layer 108 such that each dummy gate 120 is disposed between respective neighboring pairs of the epitaxial source/drain regions 142. In some embodiments, the gate spacers 124 are used to separate the epitaxial source/drain regions 142 from the dummy gates 120 by an appropriate lateral distance so that the epitaxial source/drain regions 142 do not short out subsequently formed gates of the resulting transistors. The epitaxial source/drain regions 142 may be referred to as raised source/drain regions because they extend above a topmost surface of the substrate 102. Accordingly, the epitaxial source/drain regions 142 may horizontally extended below and over the bottom tips of the gate spacers 124, the epitaxial source/drain regions 142 may not extend to the dummy gate dielectrics 116.

The epitaxial source/drain regions 142 in the n-type device regions of the wafer may be formed by masking the p-type device regions of the wafer, and etching the top semiconductor layer 108 in the n-type device regions to form recesses 130 (e.g., as described above) in the top semiconductor layer 108. Then, the epitaxial source/drain regions 142 in the n-type device regions are epitaxially grown in the recesses 130. The epitaxial growth process used to form the epitaxial source/drain regions 142 may be a low temperature process in some embodiments. For example, the epitaxial growth process may be performed at a temperature of about 400° C. to about 600° C. By performing the epitaxy in this temperature range, stress exerted on the substrate may be advantageously reduced.

The epitaxial source/drain regions 142 may include any acceptable material, such as appropriate for n-type transistors. For example, the epitaxial source/drain regions 142 in the n-type device regions may include materials exerting a tensile strain in the channel regions, such as silicon, silicon carbide, phosphorous doped silicon carbide, silicon phosphide, or the like. The epitaxial source/drain regions 142 in the n-type device regions may have surfaces raised from respective surfaces of the top semiconductor layer 108 and may have facets.

The epitaxial source/drain regions 142 in the p-type device regions of the wafer may be formed by masking the n-type device regions of the wafer and etching the top semiconductor layer 108 in the p-type device regions to form recesses 130 (e.g., as described above) in the top semiconductor layer 108. Then, the epitaxial source/drain regions 142 in the p-type device regions are epitaxially grown in the recesses 130. The epitaxial growth process used to form the epitaxial source/drain regions 142 may be a low temperature process in some embodiments. For example, the epitaxial growth process may be performed at a temperature of about 400° C. to about 600° C. By performing the epitaxy in this temperature range, stress exerted on the substrate may be advantageously reduced.

The epitaxial source/drain regions 142 may include any acceptable material, such as appropriate for p-type transistors. For example, the epitaxial source/drain regions 142 in the p-type device regions may comprise materials exerting a compressive strain in the channel regions, such as silicon-germanium, boron doped silicon-germanium, germanium, germanium tin, or the like. The epitaxial source/drain regions 142 in the p-type device regions may also have surfaces raised from respective surfaces of the top semiconductor layer 108 and may have facets.

The epitaxial source/drain regions 142 may be implanted with dopants to form source/drain regions, followed by an anneal. The source/drain regions may have an impurity concentration of between about $10^{19}$ cm$^{-3}$ and about $10^{21}$ cm$^{-3}$. The p-type impurities may be boron, boron fluoride, indium, or the like. The n-type impurities may be phosphorus, arsenic, antimony, or the like. In some embodiments, the epitaxial source/drain regions 142 may be in situ doped during growth.

The epitaxial source/drain regions 142 extend the depth D2 into the top semiconductor layer 108. As discussed above, the depth D2 may be in the range of about 10 Å to about 100 Å. By extending the source/drain regions 142 more deeply in the top semiconductor layer 108, diffusion of dopants from the source/drain region 142 into the undoped channel region 150 of the transistor can be reduced. By reducing dopant diffusion, parasitic resistance of the channel region 150 can be advantageously reduced. For example, it has been observed in simulation data that parasitic resistance be reduced by about 40Ω per μm when source/drain regions 142 extend the depth D2 of about 20 Å. It has also been observed in simulation data that a performance boost of 6% or more can be achieved in nMOS transistors with embodiment source/drain regions 142 extending the above described depth D2 into the top semiconductor layer 108.

Figure 11:
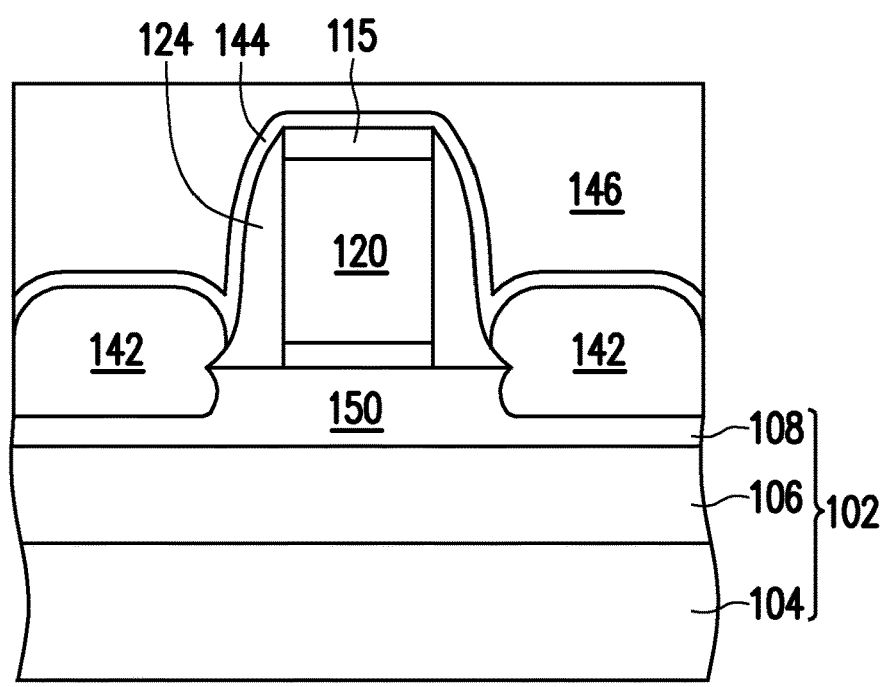

In FIG. 11, a first interlayer dielectric (ILD) 146 is deposited over the structure illustrated in FIG. 10. The first ILD 146 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 144 is disposed between the first ILD 146 and the epitaxial source/drain regions 142, the masks 115, and the gate spacers 124. The CESL 144 may comprise a dielectric material, such as, silicon nitride, silicon oxide, silicon oxynitride, or the like, having a different etch rate than the material of the overlying first ILD 146.

Figure 12:
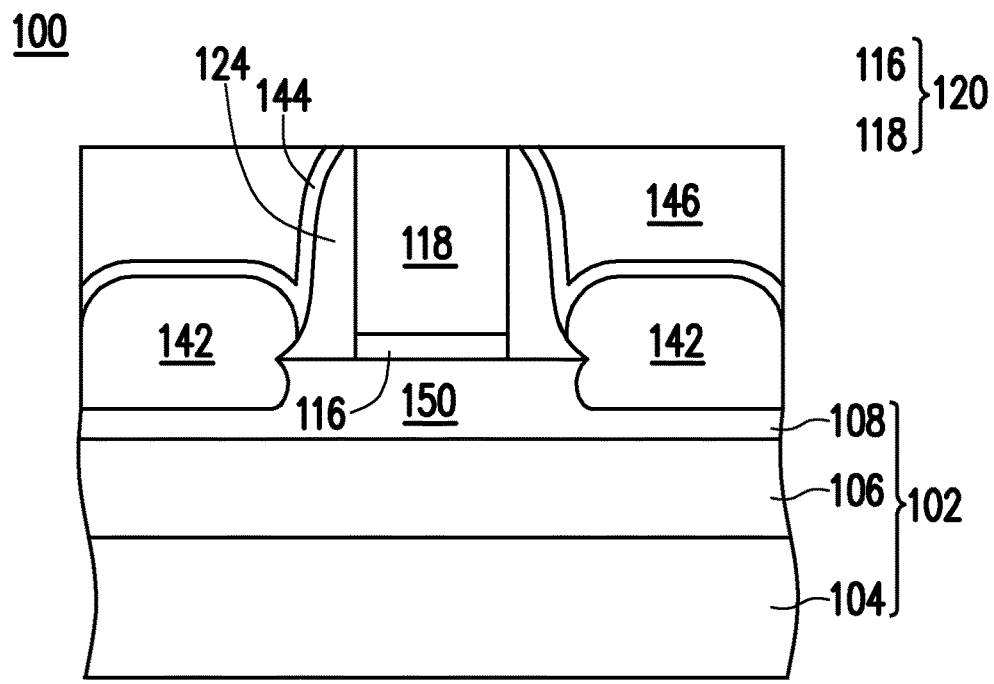

In FIG. 12, a planarization process, such as a CMP, may be performed to level the top surface of the first ILD 146 with the top surfaces of the dummy gates 120 or the masks 115. The planarization process may also remove the masks 115 on the dummy gates 120 and the gate spacers 126 along sidewalls of the masks 115. After the planarization process, top surfaces of the dummy gates 120, the gate spacers 126, and the first ILD 146 are level. Accordingly, the top surfaces of the dummy gates 120 are exposed through the first ILD 146. In some embodiments, the masks 115 may remain, in which case the planarization process levels the top surface of the first ILD 146 with the top surfaces of the top surface of the masks 115.

Figure 13:
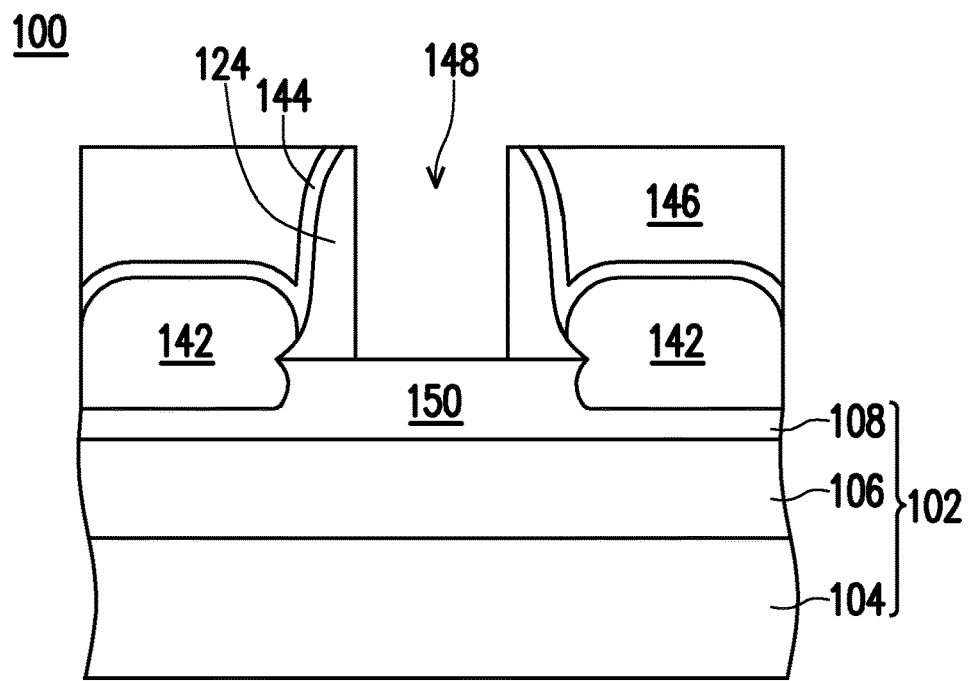

In FIG. 13, the dummy gate electrodes 118 and the masks 115 if present, are removed in an etching step(s), so that recesses 148 are formed. In some embodiments, only the dummy gate electrodes 118 are removed and the dummy gate dielectrics 116 remains and is exposed by the recesses 148. In some embodiments, the dummy gate dielectrics 116 is removed from recesses 148 in a first region of a die (e.g., a core logic region) and remains in recesses 148 in a second region of the die (e.g., an input/output region). In some embodiments, the dummy gate electrodes 118 are removed by an anisotropic dry etch process. For example, the etching process may include a dry etch process using reaction gas(es) that selectively etch the dummy gate electrodes 118 without etching the first ILD 146 or the gate spacers 124. Each recess 148 exposes and/or overlies a channel region 150 of the top semiconductor layer 108. Each channel region 150 is disposed between neighboring pairs of the dummy gate dielectrics 116 may be used as an etch stop layer when the dummy gate electrodes 118 are etched. The dummy gate dielectrics 116 may then be optionally removed after the removal of the dummy gate electrodes 118.

Figure 14:
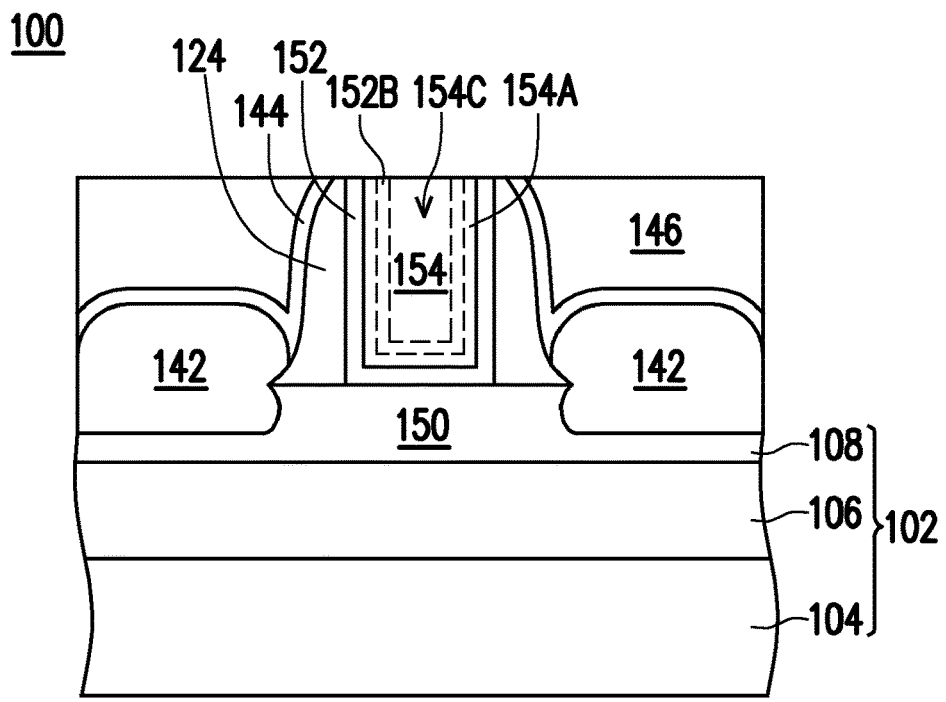

In FIG. 14, gate dielectric layers 152 and gate electrodes 154 are formed for replacement gates. Gate dielectric layers 152 are deposited conformally in the recesses 148, such as on the top surfaces of the top semiconductor layer 108 and on sidewalls of the gate spacers 124. The gate dielectric layers 152 may also be formed on the top surface of the first ILD 146. In accordance with some embodiments, the gate dielectric layers 152 comprise silicon oxide, silicon nitride, or multilayers thereof. In some embodiments, the gate dielectric layers 152 include a high-k dielectric material, and in these embodiments, the gate dielectric layers 152 may have a k value greater than about 7.0, and may include a metal oxide or a silicate of hafnium, aluminum, zirconium, lanthanum, manganese, barium, titanium, lead, and combinations thereof. The formation methods of the gate dielectric layers 152 may include Molecular-Beam Deposition (MBD), ALD, PECVD, and the like. In embodiments where portions of the dummy gate dielectrics 116 remains in the recesses 148, the gate dielectric layers 152 include a material of the dummy gate dielectrics 116 (e.g., SiO$_2$).

The gate electrodes 154 are deposited over the gate dielectric layers 152, respectively, and fill the remaining portions of the recesses 148. The gate electrodes 154 may include a metal-containing material such as titanium nitride, titanium oxide, tantalum nitride, tantalum carbide, cobalt, ruthenium, aluminum, tungsten, combinations thereof, or multi-layers thereof. For example, the gate electrodes 154 may comprise any number of liner layers 154A, any number of work function tuning layers 154B, and a fill material 154C. After the filling of the recesses 148, a planarization process, such as a CMP, may be performed to remove the excess portions of the gate dielectric layers 152 and the material of the gate electrodes 154, which excess portions are over the top surface of the ILD 146. The remaining portions of material of the gate electrodes 154 and the gate dielectric layers 152 thus form replacement gates of the resulting transistors. The gate electrodes 154 and the gate dielectric layers 152 may be collectively referred to as a "gate stack."

The formation of the gate dielectric layers 152 in the n-type device regions and the p-type device regions may occur simultaneously such that the gate dielectric layers 152 in each region are formed from the same materials, and the formation of the gate electrodes 154 may occur simultaneously such that the gate electrodes 154 in each type of region are formed from the same materials. In some embodiments, the gate dielectric layers 152 in each type of region may be formed by distinct processes, such that the gate dielectric layers 152 may be different materials, and/or the gate electrodes 154 in each region may be formed by distinct processes, such that the gate electrodes 154 may be different materials. Various masking steps may be used to mask and expose appropriate regions when using distinct processes.

Figure 15:
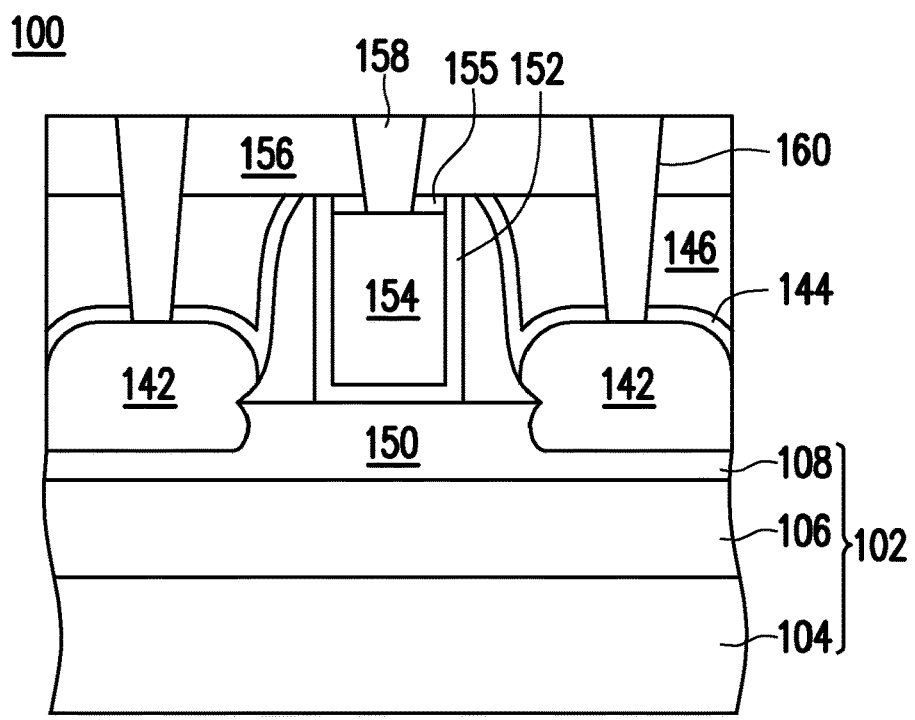

FIGS. 13 and 14 illustrate a replacement gate process. In other embodiments, the replacement gate process may be omitted, and the dummy gate electrodes 118 and the dummy gate dielectrics 116 may be used as the functional gate electrode and gate dielectric layers of the resulting transistor. In some embodiments, the In FIG. 15, a second ILD 156 is deposited over the first ILD 146. In some embodiment, the second ILD 156 is a flowable film formed by a flowable CVD method. In some embodiments, the second ILD 156 is formed of a dielectric material such as PSG, BSG, BPSG, USG, or the like, and may be deposited by any suitable method, such as CVD and PECVD. In accordance with some embodiments, before the formation of the second ILD 156, the gate stack (including a gate dielectric layer 152 and a corresponding overlying gate electrode 154) is recessed, so that a recess is formed directly over the gate stack and between opposing portions of gate spacers 124, as illustrated in FIG. 15. A gate mask 155 comprising one or more layers of dielectric material, such as silicon nitride, silicon oxynitride, or the like, is filled in the recess, followed by a planarization process to remove excess portions of the dielectric material extending over the first ILD 146. The subsequently formed gate contacts 158 penetrate through the gate mask 155 to contact the top surface of the recessed gate electrode 154.

As also illustrated by FIG. 15, gate contacts 158 and source/drain contacts 160 are formed through the second ILD 156 and the first ILD 146 in accordance with some embodiments. Openings for the source/drain contacts 160 are formed through the first and second ILDs 146 and 156, and openings for the gate contact 110 are formed through the second ILD 156 and the gate mask 155. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 156. The remaining liner and conductive material form the source/drain contacts 160 and gate contacts 158 in the openings. An anneal process may be performed to form a silicide at the interface between the epitaxial source/drain regions 142 and the source/drain contacts 160. The source/drain contacts 160 are physically and electrically coupled to the epitaxial source/drain regions 142, and the gate contacts 158 are physically and electrically coupled to the gate electrodes 106. The source/drain contacts 160 and gate contacts 158 may be formed in different processes, or may be formed in the same process. Although shown as being formed in the same cross-sections, it should be appreciated that each of the source/drain contacts 160 and gate contacts 158 may be formed in different cross-sections, which may avoid shorting of the contacts.

Thus, an embodiment device 100 is formed. The device may include FDSOI transistors having raised source/drain regions 142. The FDSOI transistors may be formed on a top silicon layer 108 of a SOI substrate 102. To form the source/drain regions 142, the top silicon layer 108 may be etched to define source/drain recesses 130 using multiple etching process, for example. The etching provides source/drain recesses 130 that allows the source/drain region 142 to extend deeper into the top silicon layer 108, thereby reducing parasitic resistance in the transistor and improving electrical performance. Further, at least about 10Å to about 50Å of the top silicon 108 remains underneath the source/drain region 142, which advantageously provides a sufficiently thick top silicon layer 108 to support the overlying features during subsequent processing steps. Thus, manufacturing defects (e.g., SOI substrate cracking caused by CTE mismatch between the top silicon and the underlying buried oxide (BOX) layer) can be advantageously reduced.

In some embodiments, a method includes forming a gate structure over a silicon on insulator (SOI) substrate, the SOI substrate comprising: a base semiconductor layer; an insulator layer over the base semiconductor layer; and a top semiconductor layer over the insulator layer; depositing a gate spacer layer over a top surface and along a sidewall of the gate structure; etching the gate spacer layer to define a gate spacer on the sidewall of the gate structure; after etching the gate spacer layer, etching a recess into the top semiconductor layer using a first etch process; after the first etch process, extending the recess further into the top semiconductor layer using a second etch process, the first etch process is different from the second etch process; and after the second etch process, forming a source/drain region in the recess. In some embodiments, after the first etch process and before the second etch process, the recess extends a depth of less than 6Å into the top semiconductor layer. In some embodiments, after the second etch process, the recess extends a depth of 10Å to 100Å into the top semiconductor layer. In some embodiments, after the second etch process, a thickness of the top semiconductor layer under the recess is in a range of 10Å to 50Å. In some embodiments, after the second etch process, a thickness of the top semiconductor layer under the recess is in a range of 20Å to 30Å. In some embodiments, the second etch process is a fluorine-ozone mixture (FOM) process. In some embodiments, the FOM process is a cyclical process, and wherein each cycle of the FOM process comprises: oxidizing portions of the top semiconductor layer exposed by the recess using ozone to form an oxide region in the top semiconductor layer; and etching the oxide region using diluted hydrogen fluoride (dHF). In some embodiments, the second etch process is a dry etch process using a chlorine-comprising gas. In some embodiments, the second etch process is a wet etch process using $H_3PO_4$. In some embodiments, etching the gate spacer layer comprises a third etch process, the third etch process and the first etch process are each dry etch processes, and the third etch process is performed at a higher RF power than the first etch process.

In some embodiments, a method includes forming a gate stack on a silicon on insulator (SOI) substrate, the SOI substrate comprising a top semiconductor layer on an insulator layer; forming a gate spacer on a sidewall of the gate stack; after forming the gate spacer, etching the top semiconductor layer to define a recess in the top semiconductor layer; extending the recess further into the top semiconductor layer using a fluorine-ozone mixture (FOM) process, wherein each cycle of the FOM process comprises: forming an oxide region in the top semiconductor layer, the oxide region being on sidewalls and a bottom surface of the recess; and etching away the oxide region; and after the FOM process, growing a source/drain region in the recess. In some embodiments, the source/drain region extends a distance of 10 Å to 100Å into the top semiconductor layer. In some embodiments, a portion of the top semiconductor layer is under the source/drain region and separates the source/drain region from the insulator layer, a thickness of the portion of the top semiconductor layer is in a range of 10 Å to 50Å. In some embodiments, the thickness of the portion of the top semiconductor layer is in a range of 20 Å to 30Å.

In some embodiments, a device includes a silicon on insulator (SOI) substrate, the SOI substrate comprising: a base semiconductor layer; an insulator layer over the base semiconductor layer; and a top semiconductor layer over the insulator layer; a gate stack on the SOI substrate; a source/drain region on a side of the gate stack, wherein the source/drain region extends a first distance into the top semiconductor layer, the first distance is in a range of 10Å to 100Å, a portion of the top semiconductor layer is under the source/drain region and separates the source/drain region from the insulator layer, and a thickness of the portion of the top semiconductor layer is in a range of 10Å to 50Å. In some embodiments, the source/drain region extends above a top most surface of the top semiconductor layer. In some embodiments, the thickness of the portion of the top semiconductor layer is in a range of 20Å to 30Å. In some embodiments, the first distance is in a range of 20Å to 30Å. In some embodiments, the first distance is in a range of 17Å to 25Å. In some embodiments, the device further includes a gate spacer on a sidewall of the gate stack, wherein the gate spacer is between the source/drain region and the gate stack, and the source/drain region extends under the gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a silicon on insulator (SOI) substrate, the SOI substrate comprising:
a base semiconductor layer;
an insulator layer over the base semiconductor layer; and
a top semiconductor layer over the insulator layer;
a gate stack on the SOI substrate; a gate spacer on a sidewall of the gate stack; a source/drain region on a side of the gate stack, wherein the source/drain region extends a first distance into the top semiconductor layer, the first distance being in a range of 10 A° to 100 A°, a portion of the top semiconductor layer being disposed under the source/drain region and separating the source/drain region from the insulator layer, and a thickness of the portion of the top semiconductor layer disposed under the source/drain region being in a range of 10 A° to 50 A°, and wherein the gate spacer extends between an upper portion of the source/drain region and a lower portion of the source/drain region along a line perpendicular to a top surface of the SOI substrate; and a contact etch stop layer over the source/drain region and the gate spacer, wherein a portion of the contact etch stop layer extends between the gate spacer and the source/drain region along a line parallel to the top surface of SOI substrate, and wherein the gate spacer is disposed under the portion of the contact etch stop layer that extends between the gate spacer and the source/drain region along the line parallel to the top surface of SOI substrate, wherein the top semiconductor layer comprises concave sidewalls that are disposed under the gate spacer.

2. The device of claim 1, wherein the source/drain region extends above a top most surface of the top semiconductor layer.

3. The device of claim 1, wherein the thickness of the portion of the top semiconductor layer disposed under the source/drain region is in a range of 20 Å to 30 Å.

4. The device of claim 1, wherein the first distance is in a range of 20 Å to 30 Å.

5. The device of claim 1, wherein the first distance is in a range of 17 Å to 25 Å.

6. A device comprising:
a substrate comprising: a base layer;
an insulator layer over the base layer; and
a silicon layer over the insulator layer;
a transistor on the substrate, the transistor comprising:
a gate stack on the silicon layer;
a first source/drain region extending into the silicon layer on a first side of the gate stack, wherein the silicon layer is disposed under the first source/drain region and separates the first source/drain region from the insulator layer, and
wherein a first distance between a bottom surface of the first source/drain region and a top surface of the insulator layer is in a range of 10 A° to 50 A°; and
a second source/drain region extending into the silicon layer on a second side of the gate stack, wherein the silicon layer is disposed under the second source/drain region and separates the second source/drain region from the insulator layer;
a first gate spacer on the first side of the gate stack and overlapping the first source/drain region; a second gate spacer on the second side of the gate stack and overlapping the second source/drain region; and
a contact etch stop layer over the first source/drain region, the second source/drain region, the first gate spacer, and the second gate spacer, wherein a portion of the contact etch stop layer extends between the first gate spacer and the first source/drain region along a line parallel to a top surface of the base layer, and wherein the first gate spacer is disposed under the portion of the contact etch stop layer that extends between the first gate spacer and the first source/drain region along the line parallel to the top surface of the base layer, wherein a sidewall of the silicon layer under the first gate spacer is concave.

7. The device of claim 6, wherein a second distance between a bottom surface of the first source/drain region and the top surface of the insulator layer is in a range of 10 Å to 50 Å.

8. The device of claim 6, wherein the first source/drain region extends a first depth into the silicon layer, and wherein the first depth is in a range of 10 Å to 100 Å.

9. The device of claim 8, wherein the second source/drain region extends a second depth into the silicon layer, and wherein the second depth is in a range of 10 Å to 100 Å.

10. The device of claim 8, wherein the first depth is in a range of 20 Å to 30 Å.

11. The device of claim 8, wherein the first depth is in a range of 17 Å to 25 Å.

12. The device of claim 6, wherein the contact etch stop layer extends between the second gate spacer and the second source/drain region along the line parallel to the top surface of the base layer.

13. A device comprising:
   a silicon on insulator (SOI) substrate, the SOI substrate comprising:
   a base layer;
   an insulator layer over the base layer; and
   a top semiconductor layer over the insulator layer;
   a gate stack on the SOI substrate;
   a source/drain region on a side of the gate stack, the source/drain region extending a depth of 10Å to 100Å into the top semiconductor layer, a portion of the top semiconductor layer being disposed under the source/drain region and separating the source/drain region from the insulator layer;
   a gate spacer on a sidewall of the gate stack, wherein the gate spacer is disposed above and overlaps a bottom region of the source/drain region, and wherein an upper region of the source/drain region is disposed above and overlaps the gate spacer; and
   a contact etch stop layer over the source/drain region and the gate spacer, wherein a portion of the contact etch stop layer extends between the gate spacer and the source/drain region along a line parallel to a top surface of SOI substrate, and wherein the gate spacer is disposed under the portion of the contact etch stop layer that extends between the gate spacer and the source/drain region along the line parallel to the top surface of SOI substrate, wherein a sidewall of the top semiconductor layer under the gate spacer is concave.

14. The device of claim 13, wherein a thickness of a first portion of the top semiconductor layer disposed under the source/drain region being in a range of 10 Å to 50 Å.

15. The device of claim 14, wherein the thickness of the first portion of the top semiconductor layer disposed under the source/drain region is in a range of 20 Å to 30 Å.

16. The device of claim 13, wherein the sidewall of the top semiconductor layer under the gate spacer is curved.

* * * * *